(12) United States Patent
Chung

(10) Patent No.: US 6,673,656 B2
(45) Date of Patent: Jan. 6, 2004

(54) SEMICONDUCTOR CHIP PACKAGE AND MANUFACTURING METHOD THEREOF

(75) Inventor: Chih Ming Chung, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/121,510

(22) Filed: Apr. 15, 2002

(65) Prior Publication Data

US 2003/0194830 A1 Oct. 16, 2003

(51) Int. Cl.⁷ ................................................ H01L 21/50
(52) U.S. Cl. ...................... 438/127; 438/612; 438/125
(58) Field of Search ................................ 438/612, 614, 438/613, 127, 108, 121, 122, 112, 125, 126, 118, 119

(56) References Cited

U.S. PATENT DOCUMENTS 5,070,041 A * 12/1991 Katayama et al. .......... 438/127
6,331,453 B1 * 12/2001 Bolken et al. .............. 438/127

* cited by examiner

Primary Examiner—Caridad Everhart
(74) Attorney, Agent, or Firm—Lowe Hauptman Gilman & Berner LLP

(57) ABSTRACT

This invention provides a method for manufacturing a semiconductor chip package which mainly utilizes a substrate having a organic surface protection thereon to package a central-pad chip. In the encapsulating process, since the molding flash is completely formed on the surface of the organic surface protection, the molding flash can be easily removed together with the organic surface protection without damaging the substrate surface. This invention further provides a method for manufacturing the substrate.

4 Claims, 4 Drawing Sheets

SEMICONDUCTOR CHIP PACKAGE AND MANUFACTURING METHOD THEREOF

BACKGROUND OF THE INVENTION

1. Field of the Invention

This invention relates to a package for a central-pad chip and a manufacturing method thereof, and more particularly, to an improved substrate and a method for dealing with molding flash.

2. Description of the Related Art

FIG. 1 depicts a conventional package 100 for use in packaging a central-pad chip. The package 100 comprises a semiconductor chip 110 mounted on a substrate 120. The semiconductor chip 110 has a plurality of bonding pads (not shown) centrally formed on the active surface thereof. The substrate 120 has a slot 122 corresponding to the chip connection pads of the semiconductor chip 110. The semiconductor chip 110 is securely attached to the upper surface of the substrate 120 by an adhesive layer 112. The lower surface of the substrate 120 is provided with a plurality of solder pads 124 and chip connection pads 126. Each of the solder pads 124 is connected to one end of the corresponding chip connection pad 126 through a conductive trace (not shown) formed on the substrate 120. The chip connection pads 126 of the substrate are electrically connected to the bonding pads of the semiconductor chip 110 through a plurality of bonding wires (e.g. gold wires 130). Typically, the lower surface of the substrate 120 is covered by a solder mask 128 in a manner that the solder pads 124 and the chip connection pads 126 are exposed through the solder mask. Each solder pad 124 is provided with a solder ball 140 for making external electrical connection.

Referring to FIG. 1 again, the conventional package 100 has a package body for protecting the semiconductor chip against the external moisture and/or contamination. The package body includes a first portion 150a formed on the upper surface of the substrate 120 and around the semiconductor chip 110, and a second portion 150b formed within the slot 122 of the substrate 120 for sealing the wires 130. The package body is generally formed by transfer molding.

However, when the second portion 150b of the package body is formed by the plastic molding method, the package encapsulant not only seals the slot 122 of the substrate 120 and the wires 130, but extends along the interface between the mold and the substrate to the surface of the solder mask 128 near the slot 122. The excess encapsulant hereinafter called "flash", i.e. encapsulant other than that necessary to seal the slot and the wires, must be removed. However, when the excess encapsulant is peeled away from the surface of the solder mask 128, it always causes damage to the package 100. This damage can be cosmetic (e.g. marring of the substrate surface) and/or functional (e.g. tearing away of the solder mask on the substrate surface to undesirably expose the electrically conductive traces, and/or weakening or breaking of the seal between the package body and the substrate surface).

Furthermore, in mass production, it is desirable to form the package body by mold array package (MAP) molding process. However, the mold used in MAP molding process often fails to seal tightly against the substrate surface near the slot 122, and hence the flash becomes a more serious problem and even extends along the interface between the mold and the substrate to the surface of the solder pads 124 near the slot 122.

Thus, a need continues to exist in semiconductor packaging industry for improved substrates and methods, which deals with unwanted flash.

SUMMARY OF THE INVENTION

It is an object of the present invention to provide an improved substrate and a method for molding the central-pad chip, wherein the molding flash could be removed easily without damage.

To achieve the above listed and other objects, the present invention provides a substrate having opposing upper and lower surfaces and a slot defined therein. The upper surface of the substrate is adapted for receiving a semiconductor chip. The lower surface of the substrate is provided with a plurality of solder pads and a plurality of chip connection pads electrically connected to the solder pads respectively. The lower surface of the substrate is covered by a solder mask such that the solder pads and the chip connection pads are exposed through the solder mask. Preferably, both the solder pads and the chip connection pads have a layer of nickel formed on the surface thereof and a layer of gold or palladium formed on the nickel layer. The substrate is characterized by having an organic surface protection formed on the solder mask and around the slot of the substrate, wherein the chip connection pads remain uncovered by the organic surface protection. It should be understood that the organic surface protection might cover the entire surface of the solder mask and the solder pads. Preferably, the organic surface protection is made of an organic solderability preservative (OSP). Furthermore, the substrate according to the invention is one of an array of substrates formed in a strip configuration.

To achieve the above listed and other objects, the present invention further provides a method for manufacturing a semiconductor chip package utilizing the aforementioned substrate, which comprises the following steps: (a) providing a semiconductor chip having a plurality of chip connection pads centrally formed thereon; (b) mounting the semiconductor chip to the upper surface of the substrate such that the bonding pads are corresponding to the slot of the substrate; (c) wire bonding the chip connection pads of the semiconductor chip to the corresponding chip connection pads; (d) forming a package body having a first portion on the upper surface of the substrate and around the semiconductor chip, and a second portion within the slot of the substrate, wherein the molding flash is formed completely on the surface of the organic surface protection; (e) removing the organic surface protection and the molding flash thereon, and (f) forming solder balls on the solder pads after removing the organic surface protection and the molding flash. Preferably, the step of forming the package body is conducted by a mold array package (MAP) molding process.

It is noted that the molding flash is formed completely on the surface of the organic surface protection in step (d); hence, in step (e), the molding flash can be removed easily without damage. Furthermore, because the organic surface protection can cover the solder pads near the slot of the substrate, the organic surface protection can protect the solder pads from being contaminated by flash. Without the problem of the flash, the distance between the solder pads and the slot can be substantially shortened thereby improving the electrical efficiency through shortening the circuit.

This invention further provides a method for manufacturing a substrate, which comprises the following steps: (a) providing a printed circuit board having an upper surface, a lower surface and a slot defined therein, wherein the lower surface of the printed circuit board is provided with a plurality of solder pads and chip connection pads electrically connected to the solder pads respectively, and covered by a solder mask such that the solder pads and the chip connection pads are exposed through the solder mask, (b) masking the chip connection pads, e.g., by attaching a protective tape to the lower surface of the printed circuit board to cover the chip connection pads; and (c) forming an organic surface protection on the solder mask and around the slot of the substrate. Preferably, step (c) is conducted by the following steps: (1) acid cleaning and microetching the printed circuit board with the protective tape attached thereon; (2) dipping the printed circuit board into an organic solderability preservative (OSP) solution thereby forming the organic surface protection on the surface of the printed circuit board without the protection of the tape; and (3) drying the printed circuit board. Preferably, the substrate manufacturing method of the present invention further comprises a step of electroplating a layer of nickel to the solder pads and the chip connection pads on the lower surface of the substrate and the chip connection pads, and electroplating a layer of gold or palladium on the nickel layer.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
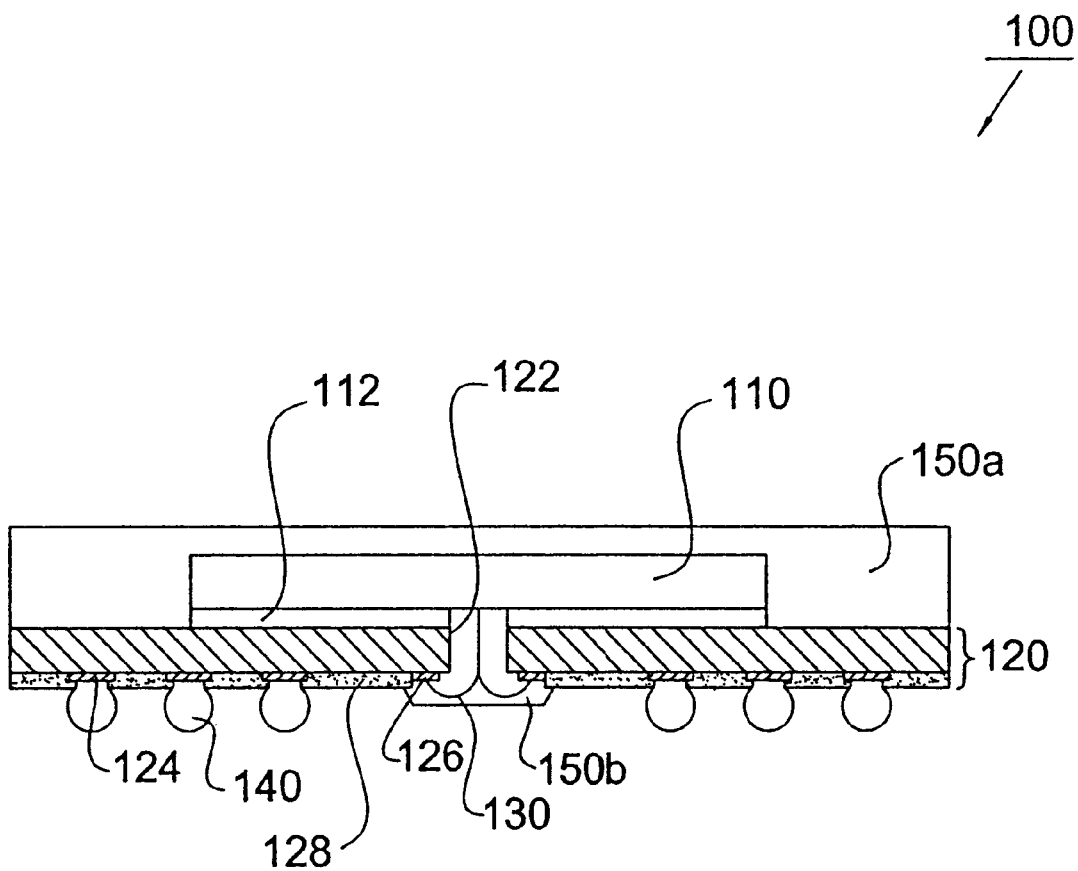
FIG. 1 is a cross-sectional view of a conventional package for use in packaging a central-pad chip.
Figure 2:
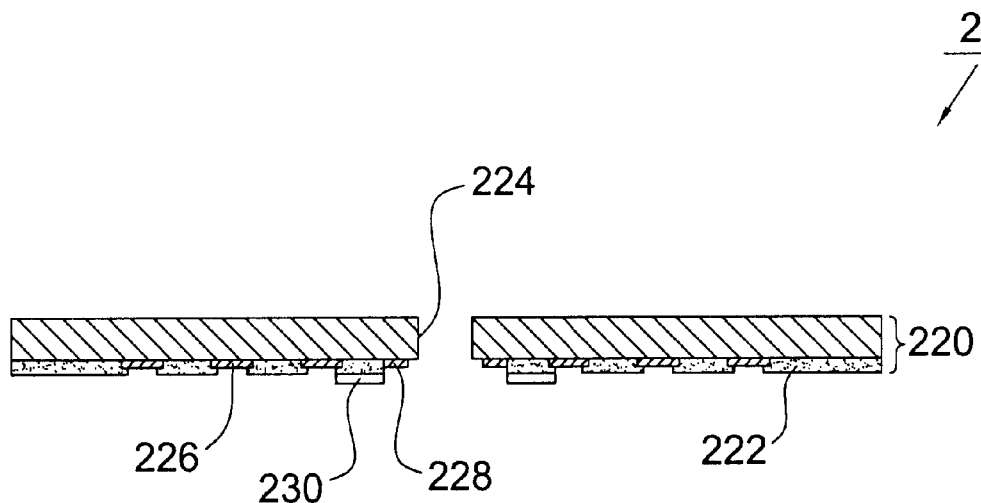
FIG. 2 is a cross-sectional view of a substrate according to a first embodiment of the present invention.

FIG. 2 shows a substrate 200 according to one embodiment of the present invention. The substrate 200 is characterized by having an organic surface protection 230 formed on the solder mask 222 of a printed circuit board 220 and around a slot 224 defined in the substrate. Preferably, the organic surface protection is made of an organic solderability preservative (OSP). The lower surface of the printed circuit board 220 is provided with a plurality of solder pads 226 and chip connection pads 228 electrically connected to the solder pads 226 respectively. The lower surface of the printed circuit board is covered by the solder mask 222 in a manner that the solder pads 226 and the chip connection pads 228 are exposed through the solder mask. The printed circuit board 220 is provided with conductive traces which constitute a network of connection for electrical ground, power and signal lines. Though only one layer of conductor circuits of the printed circuit board 220 is shown in this embodiment, a printed circuit board for use with this invention can include more than two layers of conductor circuits if desired. It should be understood that the printed circuit board 220 may be formed from a core layer made of fiberglass reinforced BT (bismaleimide-triazine) resin, or FR-4 fiberglass reinforced epoxy resin thereby increasing the mechanical strength of the substrate. Alternatively, a polyimide-based substrate may be used.

Preferably, the solder pads 226 and the chip connection pads 228 have a layer of nickel formed on the surface thereof (not shown) and a layer of gold or palladium formed on the nickel layer (not shown). The nickel/gold (or palladium) layer can protect the surfaces of the solder pads 226 and chip connection pads 228 from corrosion or contamination thereby assuring the solder-joint reliability.

Figure 3:
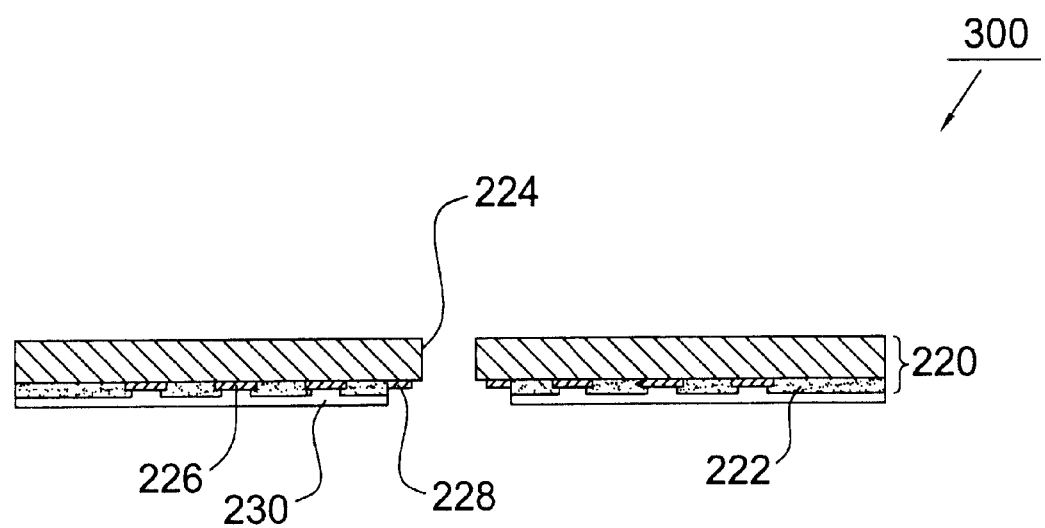
FIG. 3 is a cross-sectional view of a substrate according to a second embodiment of the present invention.

FIG. 3 shows a substrate 300 according to a second embodiment of the present invention. The substrate 300 is substantially the same as the substrate 200 shown in FIG. 2 except that the entire surface of the solder mask 222 and the solder pads 226 are covered by the organic surface protection 230.

Next, processes for forming the organic surface protection will be described. First, a protective tape is attached onto the lower surface of the printed circuit board 220 for masking the chip connection pads 228. Then, the printed circuit board with the tapes attached thereon is acid cleaned and microetched. After conducting a step of acid rinse, the printed circuit board is dipped in an organic solderability preservative (OSP) solution, thereby forming an organic surface protection on the surface of the printed circuit board without the protection of the tape. Finally, the printed circuit board is dried. The organic solderability preservative (OSP) used may be an organic hydrogen compounds like substituted benzimidazoles (e.g. a commercial solution like ENTEK-PLUS Cu-106 manufactured by Enthone-OMI, Inc.).

Figure 4:
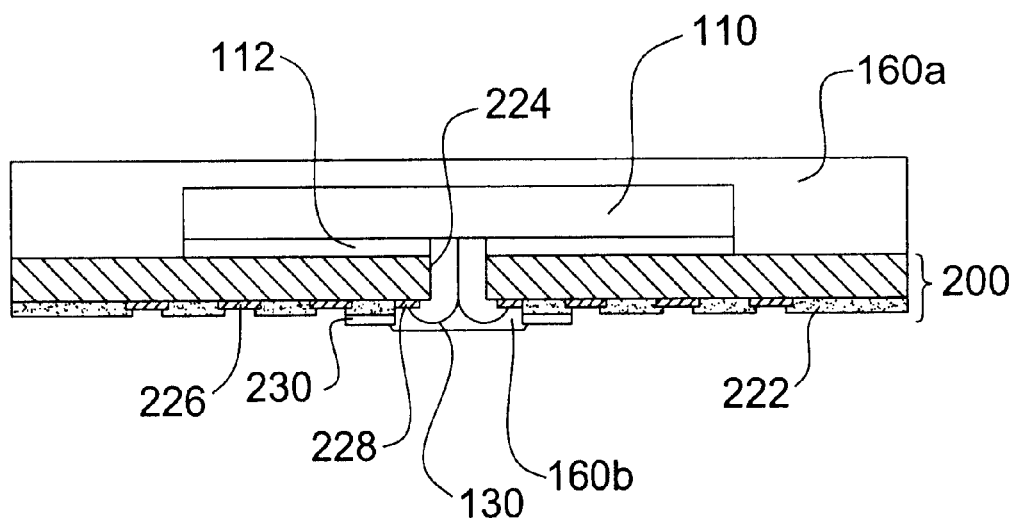
FIG. 4 is a cross-sectional view of a molded product utilizing the substrate of FIG. 2 to package a central-pad chip.
Figure 5:
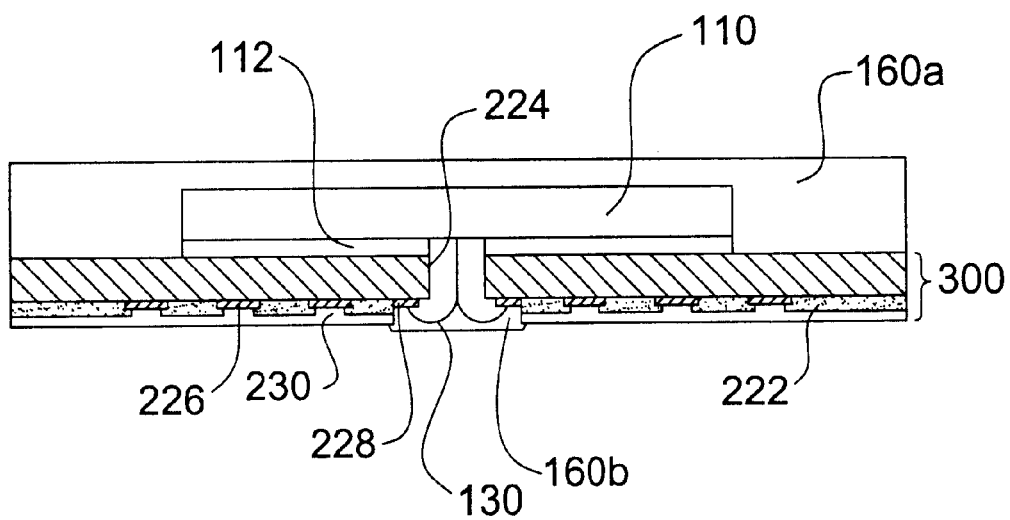
FIG. 5 is a cross-sectional view of a molded product utilizing the substrate of FIG. 3 to package a central-pad chip.

Referring to FIG. 4 and FIG. 5, semiconductor chips 110 are mounted on the upper surface of the substrates 200 and 300 by adhesive layers 112. The adhesive layer 112 may be made of, for example, a polyimide tape, adhesive glue, epoxy or thermoplastic adhesive. Thereafter, bond wires, for example, gold wires 130, are connected to bonding pads provided on the chip 110 and the chip connection pads 228 by a wire bonding machine. Finally, package bodies which comprise a first portion 160a formed on the upper surface of the substrates 200 and 300 and around the semiconductor chips 110 and a second portion 160b within the slots 224 of the substrates 200 and 300 are formed by a conventional transfer molding process. In the encapsulating process, molding flash will be completely formed on the surface of the organic surface protection 230. It is noted that the organic surface protection 230 and the molding flash thereon must be removed before the solder balls are mounted. Preferably, the molded products showed in FIG. 4 and FIG. 5 can be cleaned by a liquid method using a suitable solvent. Furthermore, the organic surface protection 230 and the molding flash thereon also can be removed by air knife.

Figure 6:
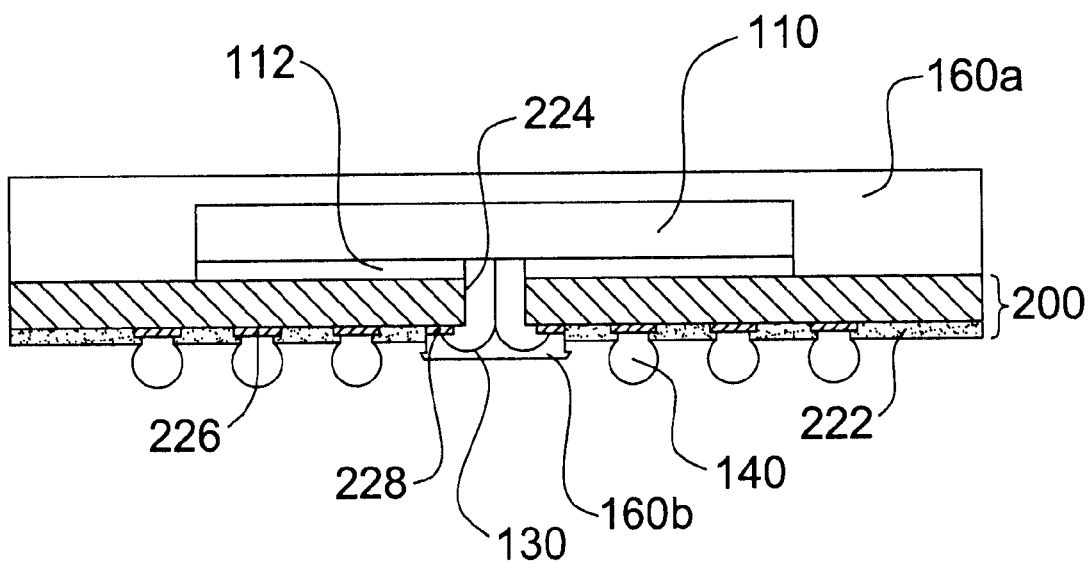
FIG. 6 is a cross-sectional view of a package utilizing the substrate according to the aformentioned embodiments of the present invention.

Referring to FIG. 6, solder balls 140 disposed on solder pads 226 are needed for attaching the final package to customers application boards. After removing the molding flash, the solder balls 140 may be formed on the solder pads 226 of the substrate by solder-ball placement or stencil printing technique.

In mass production, it is desirable to form an array of substrates 200 and 300 of the invention in a strip configuration (typically referred to as a "substrate strip" (not shown)). It is noted the above-described substrate strip is especially suitable in MAP molding process. In this embodiment, the molded product is then marked with either laser or traditional ink. Finally, post-mold curing and singulation steps are conducted to complete the packaging process.

According to the semiconductor chip package manufacturing method of the present invention, the molding flash is completely formed on the surface of the organic surface protection, so that the molding flash can be easily removed together with the organic surface protection without damaging the substrate surface. Furthermore, the organic surface protection may be formed on the solder pads near the slot of the substrate, so that the organic surface protection can protect the solder pads from being contaminated by flash. Without the problem of the flash, the distance between the solder pads and the slot can be substantially shortened thereby improving the electrical performance through shortening the circuit.

Although the invention has been explained in relation to its preferred embodiment, it is to be understood that many other possible modifications and variations can be made without departing from the spirit and scope of the invention as hereinafter claimed.

What is claimed is:

1. A method of manufacturing a substrate for a semiconductor device, said method comprising the steps of:

providing a printed circuit board having opposing upper and lower surfaces and a slot defined therein, the lower surface of the printed circuit board being, provided with a plurality of solder loads and a plurality of chip connection pads electrically connected to the solder pads, respectively, the lower surface of the printed circuit board being covered by a solder mask in a manner that the solder pads and the chip connection pads are exposed through the solder mask;

masking the chip connection pads; and forming an organic surface protection on the solder mask and around the slot of the substrate;

wherein the masking step includes the step of attaching a protective tape to the lower surface of the printed circuit board so as to cover the chip connection pads.

2. The method as claimed in claim 1, wherein the step of forming the organic surface protection includes:

acid cleaning and microetching the printed circuit board with the protective tape attached thereon;

dipping the printed circuit board into an organic solderability preservative (OSP) solution thereby forming the organic surface protection on the surface of the printed circuit board without the protection of the tape; and drying the printed circuit board.

3. The method as claimed in claim 2, wherein the entire surface of the solder mask and the solder pads is covered by the organic surface protection.

4. The method as claimed in claim 1, further comprising the steps of electroplating a layer of nickel on the solder pads and the chip connection pads of the lower surface of the substrate, and electroplating a layer of gold or palladium on the nickel layer.

* * * * *